United States Patent
Jung et al.

(10) Patent No.: US 7,498,205 B2
(45) Date of Patent: Mar. 3, 2009

(54) METHOD FOR MANUFACTURING SUBSTRATE WITH CAVITY

(75) Inventors: Hoe Ku Jung, Daejeon (KR); Myung Sam Kang, Daejeon (KR); Jung Hyun Park, Daejeon (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 236 days.

(21) Appl. No.: 11/524,404

(22) Filed: Sep. 21, 2006

(65) Prior Publication Data

US 2007/0066045 A1 Mar. 22, 2007

(30) Foreign Application Priority Data

Sep. 22, 2005 (KR) ..................... 10-2005-0088089

(51) Int. Cl.
*H01L 21/00* (2006.01)
(52) U.S. Cl. ................. 438/126; 438/118; 438/107; 257/E21.499; 257/E21.503
(58) Field of Classification Search ........... 438/106, 438/107, 108, 118, 125, 126; 257/E21.499, 257/E21.503
See application file for complete search history.

(56) References Cited

U.S. PATENT DOCUMENTS

| | | | | |
|---|---|---|---|---|
| 5,688,408 | A * | 11/1997 | Tsuru et al. | ............ 216/17 |
| 6,090,237 | A | 7/2000 | Reynolds et al. | |
| 7,192,801 | B2 * | 3/2007 | Oya | ............ 438/55 |
| 2002/0068378 | A1 | 6/2002 | McLellan et al. | |
| 2006/0051895 | A1 * | 3/2006 | Abe et al. | ............ 438/108 |
| 2007/0090511 | A1 * | 4/2007 | Borland et al. | ............ 257/691 |

FOREIGN PATENT DOCUMENTS

EP 0 980 096 2/2002

OTHER PUBLICATIONS

German Office Action issued on Sep. 17, 2008 in corresponding German Patent Application.

* cited by examiner

*Primary Examiner*—Alexander G Ghyka
*Assistant Examiner*—Seahvosh J Nikmanesh

(57) ABSTRACT

A method for manufacturing a substrate having a cavity which includes forming a barrier around a predetermined area where the cavity is to be formed on a copper foil laminated master, an internal circuit formed in the copper foil laminated master; coating a thermosetting material in the area where the cavity is to be formed; laminating a dielectric layer and a copper foil layer on the copper foil laminated master, on which the thermosetting material is coated; pressing the laminated dielectric layer and copper foil layer using a press plate, on which a protruded part is formed in an area corresponding to the area where the cavity is to be formed; forming an external circuit pattern in the upper part of the laminated dielectric layer; and dissolving the coated thermosetting material using a solvent and forming the cavity.

6 Claims, 6 Drawing Sheets

METHOD FOR MANUFACTURING SUBSTRATE WITH CAVITY

BACKGROUND OF THE INVENTION

1. Field of the Invention

The present invention relates to a stacked-type semiconductor package module, more specifically to a method for manufacturing a substrate, on which a cavity is formed.

2. Description of the Related Art

With the development of the electronics industry, there has been increasing demands for electronic parts that perform better and are smaller. To accommodate these demands, the semiconductor packing technologies have been evolving from packing one integrated circuit on one substrate to packing several integrated circuits on one substrate. Moreover, to address the need for realizing high-performance, high-density packages, and to meet the demand for these packages, the "package on package (POP)" technology has been introduced. However, minimizing the thickness of the package has been a challenge to overcome for successful implementation of the POP technology.

FIG. 1 is a sectional view of a package on package in accordance with the prior art. FIG. 1 shows a lower package 110, an upper package 120, an upper solder ball 103, and a lower solder ball 140.

The conventional ball grid array (BGA) semiconductor package has a substrate body, in which a plurality of patterned conductive wires are installed. On top of the substrate body are a plurality of chip pads, to which semiconductor chips are wire-bonded. In addition, some area of the top of the substrate body is molded with an epoxy compound and forms a molding part, such that the semiconductor chip and metal wire are enveloped. Adhered to the bottom of the substrate are a plurality of solder balls such that the other ends of the conductive wires installed in the substrate can be connected. This structure of a conventional ball grip array semiconductor package is too thick to be stacked as a highly integrated memory module within a limited area.

The lower package 110 of the conventional package on package has a dual-level structure, and an integrated circuit is mounted on the surface of this substrate. The substrate of the lower package 100 is manufactured in the same method as manufacturing a general printed circuit board. The increasing density in the semiconductor package module necessitates the mounting of a plurality of integrated circuits. With the conventional method, it is difficult to increase the mounting in the lower package 110 while maintaining the overall height of the package on package. The die-thinning method, which reduces the thickness of a semiconductor chip, can be one way of reducing the height, but this raises the issue of function-error with a prolonged operation. Therefore, improvement in mounting capacity of the package on package is attempted by reducing the thickness of the substrate.

Since there are limitations to how thin the substrate can be made, the number of integrated circuits that can be mounted in the lower semiconductor package is also limited. Besides, embedding a semiconductor package in the substrate requires a drilling process, which is complicated and costly.

SUMMARY OF CERTAIN INVENTIVE ASPECTS

The present invention features a method for manufacturing a substrate with a cavity that manufactures a package on package substrate, on which a plurality of integrated circuits can be mounted by reducing the thickness of the substrate.

The present invention also provides a method for manufacturing a substrate with a cavity that can reduce the overall thickness of the semiconductor package by mounting the integrated circuits in the cavity.

The present invention also provides a method for manufacturing a substrate with a cavity that can simplify the process by mounting the integrated circuits in the cavity formed on the substrate, without using a separate drilling process.

Moreover, the present invention provides a method for manufacturing a substrate with a cavity that can make the package relatively thinner than other packages, on which the same number of integrated circuits are mounted, by incorporating the integrated circuits in the cavity formed on the substrate.

Furthermore, the present invention provides a method for manufacturing a substrate with a cavity that has a better finishing process than the conventional cavity-forming process by forming the cavity without using a separate drilling process.

The present invention also provides a method for manufacturing a substrate with a cavity that can mount multiple tiers of a plurality of integrated circuits in a lower package of a package on package.

Moreover, the present invention provides a method for manufacturing a substrate with a cavity that can reduce the thickness of a package on package substrate having at least 3 tiers.

In addition, the present invention provides a method for manufacturing a substrate with a cavity that can reduce the manufacturing cost by eliminating the need for an additional cavity-forming process.

An aspect of the present invention features a method for manufacturing a substrate, on which a cavity is formed. The method can comprise (a) forming a barrier around a predetermined area where the cavity is to be formed on a copper foil laminated master, an internal circuit formed in the copper foil laminated master; (b) coating a thermosetting material in the area where the cavity is to be formed; (c) laminating a dielectric layer and a copper foil layer on the copper foil laminated master, on which the thermosetting material is coated; (d) pressing the laminated dielectric layer and copper foil layer using a press plate, on which a protruded part is formed in an area corresponding to the area where the cavity is to be formed; (e) forming an external circuit pattern in the upper part of the laminated dielectric layer; and (f) dissolving the coated thermosetting material using a solvent and forming the cavity.

The dielectric layer and copper foil layer can be a resin coated copper foil, or the dielectric layer can be a prepreg.

The barrier can be printed by use of a screen method or by exposing a thermosetting film.

The glass transition temperature (Tg) of the thermosetting material can be higher than the glass transition temperature (Tg) of the dielectric layer.

The thermosetting material can be a material that does not mix with the dielectric layer.

The method can further comprise (g) depositing in the formed cavity a bonding pad for electrically connecting an element and the substrate, by use of electrolytic plating or electroless plating.

BRIEF DESCRIPTION OF THE DRAWINGS

These and other features, aspects, and advantages of the present invention will become better understood with regard to the following description, appended claims, and accompanying drawings where:

DETAILED DESCRIPTION OF CERTAIN INVENTIVE EMBODIMENTS

Figure 1:
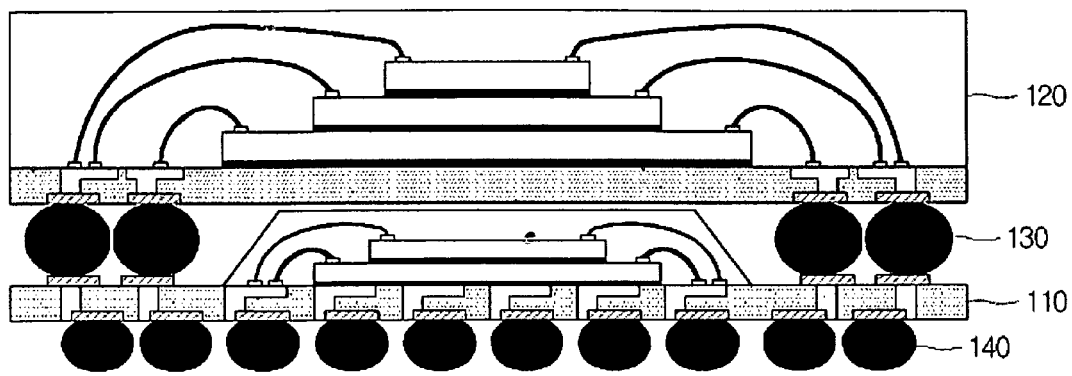
FIG. 1 shows a sectional view of a package on package in accordance with the prior art.

Hereinafter, preferred embodiments of the method for manufacturing a substrate with a cavity will be described in detail with reference to the accompanying drawings. In referencing the accompanying drawings, identical elements are given the same reference numerals, regardless of their figure numbers, and any redundant description thereof will be omitted. In addition, prior to describing preferred embodiments of the present invention, the method for manufacturing a general substrate will be described first. Although the method for manufacturing a multi-layer substrate is described, the present invention is by no means restricted to the method for manufacturing a multi-layer substrate.

First, an internal circuit pattern is formed on the outside of a core layer. An inner-layer base material that meets the product specification is cut, and a predetermined internal circuit pattern is formed using a dry film and a working film. Here, the inner layer can be scrubbed, and an inner layer dry film can be laminated, and the inner layer can be exposed/developed.

Then, prior to bonding the inner layer, on which the circuit pattern is formed, to the outer layer, a brown (black) oxide process is carried out in order to strengthen the adhesion. That is, the surface of a copper foil is chemically oxidized to enhance the surface roughness such that the lamination results in better adhesion. Then, by laminating the inner-layer substrate and a prepreg, prelamination and lamination processes are carried out.

Then, the laminated inner layer substrate and the prepreg are vacuum pressed. It is possible that the laminated inner layer substrate and the prepreg are hot pressed or cool pressed, instead of being vacuum pressed.

The resin and copper foil are trimmed from the corners of the panel, and an X-ray target drilling process, in which a hole is made at a target guide mark on the inner layer circuit, is carried out in preparation of a drilling process.

Then, the drilling process is carried out for electric conduction between the layers of the substrate. Here, a computer numerical control (CNC) method can be used for the drilling process.

Then, the outer layer is coated with the dry film and the working film in order to form a circuit pattern, exposed to a light of a predetermined intensity for a predetermined duration, and the unirradiated areas are developed in an etching process. After examining the outer layer and measuring the scale, a solder resist exposure film is designed and manufactured. Then, a preprocess, such as brush polishing, in which the surface of copper foil is made rough such that the solder resist ink is better adhered to the substrate, is carried out. The solder resist is then coated; the solder resist is exposed using the solder resist exposure film, designed adaptively in the preceding process; the solder resist is removed in a development process; and a variety of postprocesses, including electric/final tests, are carried out.

Figure 2:
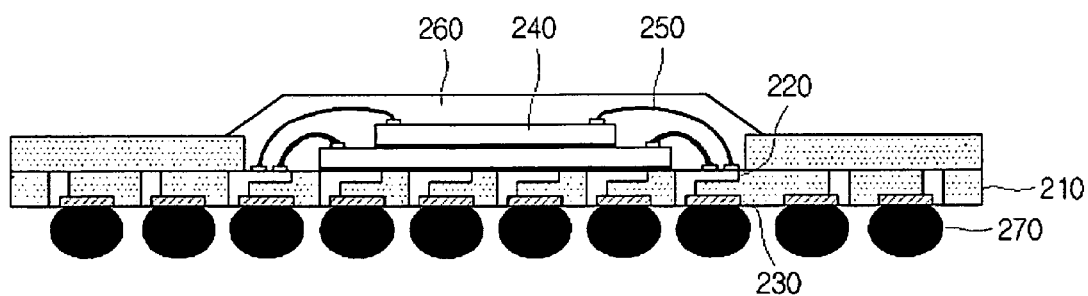
FIG. 2 shows a general illustration of a sectional view of a package on package in accordance with a preferred embodiment of the present invention.

FIG. 2 is a general illustration of the cut section of a semiconductor package, constituting a package on package, in accordance with a preferred embodiment of the present invention. Referring to FIG. 2, the semiconductor package in accordance with the present invention comprises a core layer 210, a conductive circuit 220, a metal pad 230, an integrated circuit 240, a metal wire 250, a molding part 260, and a solder ball 270.

According to the present invention, at least one integrated circuit 240 is seated and located in a cavity, which is formed on a substrate, in order to reduce the thickness of the semiconductor package. That is, the cavity is formed in the upper part of the core layer 210 of a package on package, using a dielectric layer, and the integrated circuit 240 is inserted in the formed cavity. Then, the integrated circuit 240 is electrically coupled to the conductive circuit 220 and the metal pad 230, using the metal wire 250. Using a protective material, such as epoxy resin, the molding part is formed around and on top of the integrated circuit 240.

Figure 3:
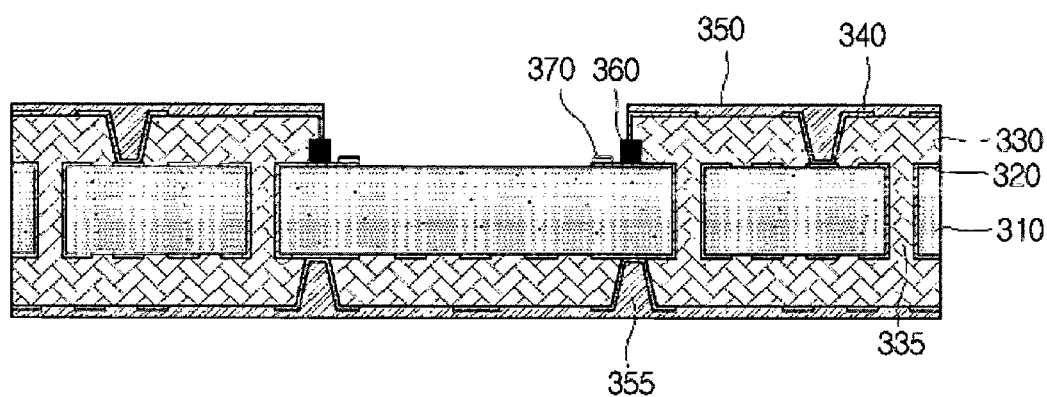
FIG. 3 shows a sectional view of a package on package in accordance with a preferred embodiment of the present invention.

FIG. 3 is a sectional view of a package on package in accordance with a preferred embodiment of the present invention. Referring to FIG. 3, the substrate in accordance with the present invention can comprise a core layer 310, an internal circuit 320, a dielectric layer 330, an interstitial via hole (IVH) 335, an external circuit 340, a solder resist 350, a blind via hole (BVH) 355, a barrier 360, and a bonding pad 370.

The core layer 310 can be a copper foil laminated master, on which the internal circuit 320 is formed, and the dielectric layer 330 can be made of a dielectric material, such as a prepreg or a resin coated copper foil (RCC).

The internal circuit 320 and the external circuit 340 can be electrically connected to each other by the IVH 335 and the BVH 355. Here, the internal circuit 320 and the external circuit 340 can also be electrically connected to each other by a plated through hole (PTH, not shown).

The barrier 360 is for preventing the flow of a thermosetting material, which is prepared for forming the cavity. In case of a copper foil laminated master, in which an internal circuit is formed, the barrier can be a dielectric paste around an area, in which the cavity is to be formed.

The bonding pad 370 is seated in the cavity and connects a semiconductor chip and the substrate. The semiconductor chip and the substrate can be coupled to each other through flip-chip bonding or wire bonding.

FIGS. 4-11 illustrate the method for manufacturing the substrate, on which the cavity is formed, used for a package on package in accordance with a preferred embodiment of the present invention.

Figure 4:
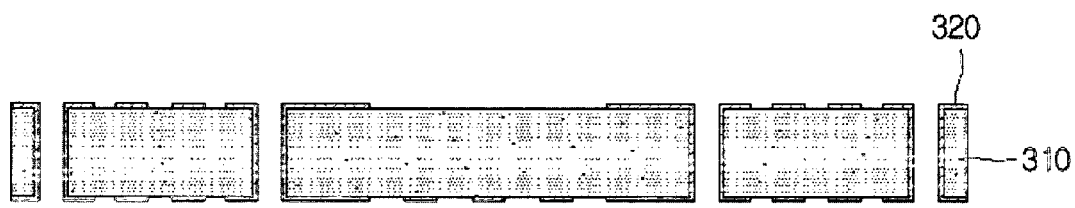
FIGS. 4-11 illustrate the method for manufacturing a substrate, on which a cavity is formed, used for a package on package in accordance with a preferred embodiment of the present invention.

Referring to FIG. 4, the internal circuit 320 is formed on the copper foil laminated master 310. Here, processes such as exposure, developing, and etching are applied using an IVH, plating, and a dry film.

Figure 5:
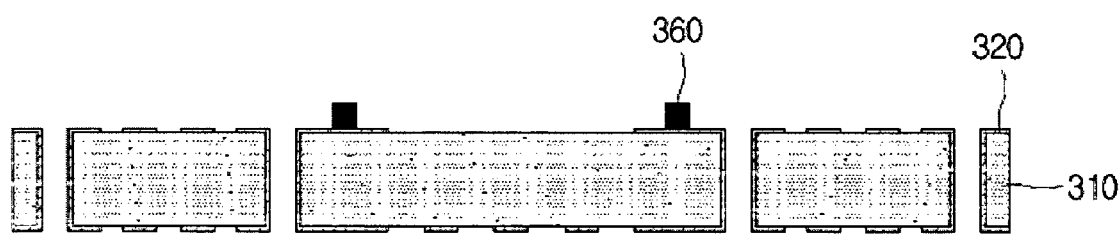

Referring to FIG. 5, the barrier 360 is formed around the area in which the cavity is to be formed. Here, the barrier 360 can be printed by using a screen method or exposing a thermosetting film. The barrier 360 blocks the flow between the thermosetting material, prepared for forming the cavity, and the dielectric layer 330. Hence, a high degree of precision is required for the barrier 360 since the boundary of the area in which the cavity is formed is defined by the barrier 360.

Figure 6:
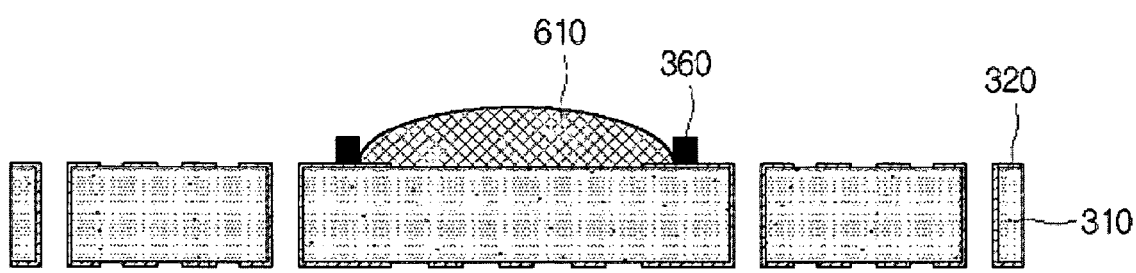

Referring to FIG. 6, the thermosetting material 610 is coated on the area in which the cavity is to be formed. The thermosetting material can be a liquid. An amount of the liquid thermosetting material that is sufficient to form the cavity is coated in the area surrounded by the barrier 360, and becomes solid in due time at room temperature. The thermosetting material can be a material that does not mix with the dielectric layer 330. If the thermosetting material does not mix with the dielectric layer 330, the thermosetting material becomes coated only in the area where the cavity is to be formed, resulting in a distinct cavity when the thermosetting material is etched.

Figure 7:
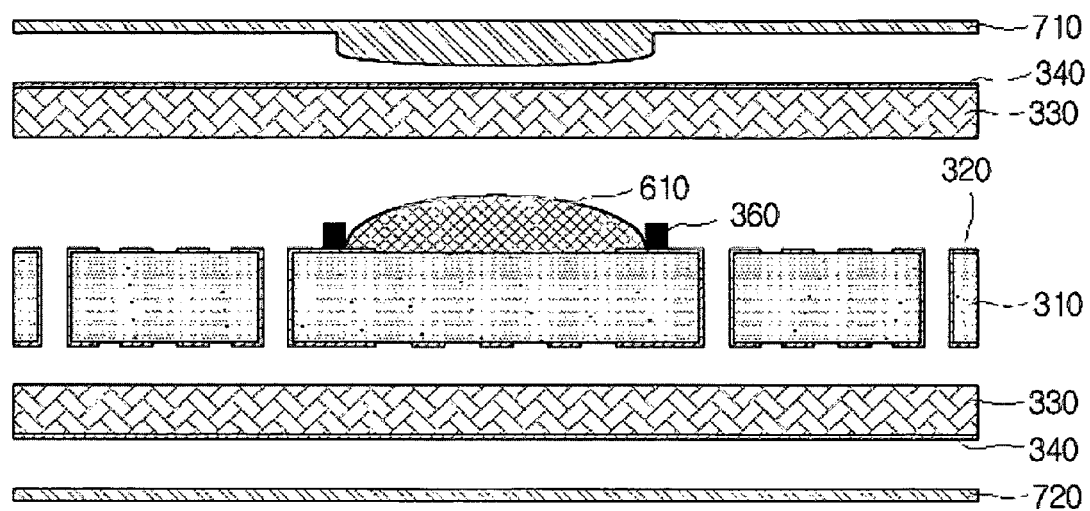

Referring to FIG. 7, the upper and lower layers of the core layer (or the copper foil laminated master in which an internal circuit is printed) are laminated with a resin coated copper foil (RCC) 330 and 340 or a prepreg (PPG) 330 and a copper foil 340. Here, a prepreg or a bonding sheet can be used for laminating the dielectric layer on the core layer (or the copper foil laminated master in which an internal circuit is printed). The press plate (or a Sus plate) 710 and 720 has a protruded part, by which the cavity is formed when pressed. The shape of the protruded part, formed on the press plate 710, corresponds to the shape of the cavity to be formed. In other words, the protruded part formed on the press plate 710 fits the area surrounded by the barrier 360.

Figure 8:
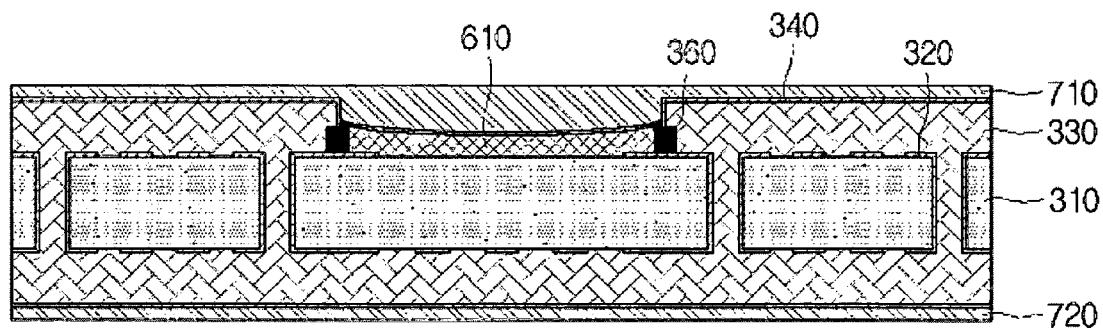

Referring to FIG. 8, the substrate is pressed by the press plate (or a Sus plate) 710 and 720 at a predetermined temperature. The material used for the substrate during the lamination has the following specifications: The liquid thermosetting material has a higher glass transition temperature (Tg) during the lamination than that of the dielectric material, and becomes a viscous liquid as the temperature rises. The dielectric material, which becomes more viscous than the liquid thermosetting material at a lower temperature, flows out of the protruded part during the lamination.

Figure 9:
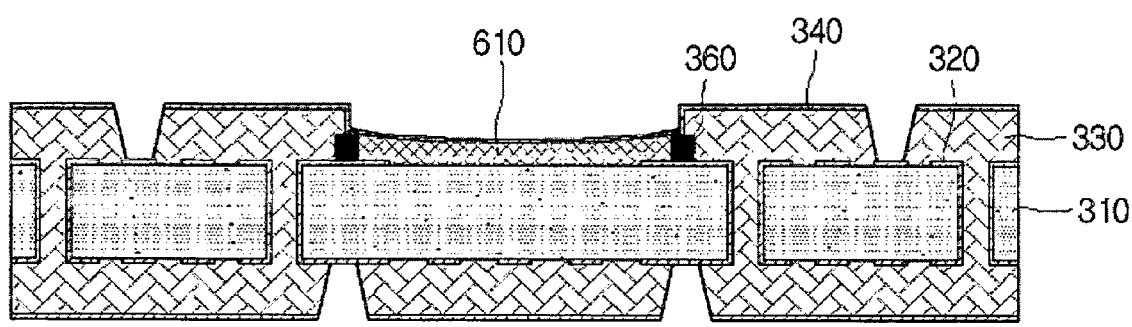

Referring to FIG. 9, the BVH 355 is formed using a laser drill after the lamination is completed, in order to couple the upper and lower layers electrically.

Figure 10:
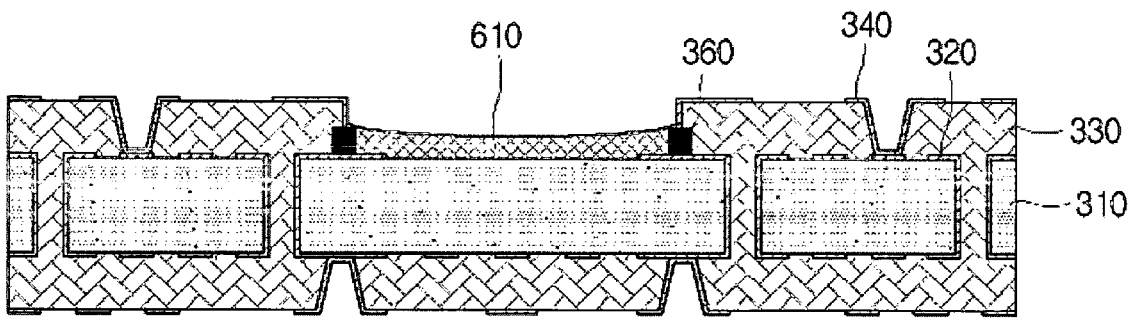
Figure 11:
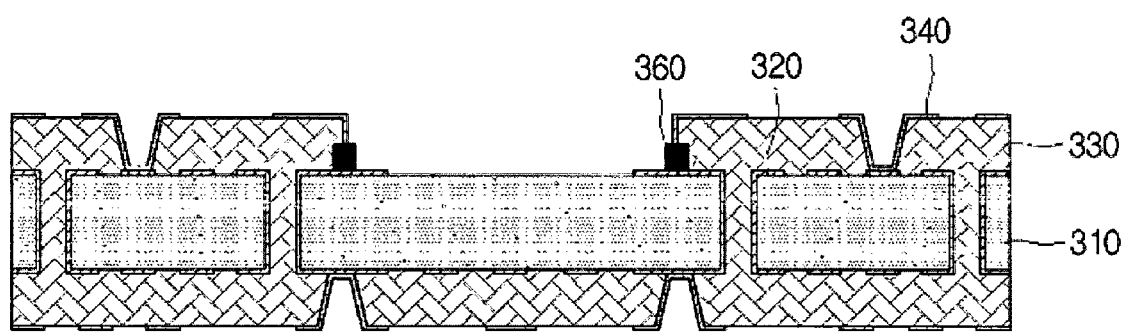

Referring to FIG. 10, the BVH 355 is plated, and a circuit pattern is formed on it. Here, the copper foil in the cavity is etched. Referring to FIG. 11, the thermosetting material, remaining in the cavity after forming the circuit, is dissolved by a solvent and removed, thereby forming the cavity. Then, a solder resist process is carried out, and the bonding pad 370 is formed through electroless plating or electrolytic plating to complete the substrate. The completed substrate with the cavity is the same substrate shown in FIG. 9.

As described above, the method in accordance with the present invention for manufacturing a substrate with a cavity can manufacture a package on package substrate, on which a plurality of integrated circuits can be mounted by reducing the thickness of the substrate.

The method for manufacturing a substrate with a cavity can reduce the overall thickness of the semiconductor package by mounting the integrated circuits in the cavity.

The method for manufacturing a substrate with a cavity can simplify the process by mounting the integrated circuits in the cavity formed on the substrate, without using a separate drilling process.

Moreover, the method for manufacturing a substrate with a cavity can make the package relatively thinner than other packages, on which the same number of integrated circuits are mounted, by incorporating the integrated circuits in the cavity formed on the substrate.

Furthermore, the present invention provides a method for manufacturing a substrate with a cavity that has a better finishing process than the conventional cavity-forming process by forming the cavity without using a separate drilling process.

The present invention also provides a method for manufacturing a substrate with a cavity that can mount multiple tiers of a plurality of integrated circuits in a lower package of a package on package.

Moreover, the present invention provides a method for manufacturing a substrate with a cavity that can reduce the thickness of a package on package substrate having at least 3 tiers.

In addition, the present invention provides a method for manufacturing a substrate with a cavity that can reduce the manufacturing cost by eliminating the need for an additional cavity-forming process.

Although a certain preferred embodiment of the present invention has been described, anyone of ordinary skill in the art to which the invention pertains should be able to understand that a large number of modifications and permutations are possible within the spirit and scope of the invention and its equivalents, which shall only be defined by the claims, appended below.

What is claimed is:

1. A method for manufacturing a substrate, the substrate having a cavity, the method comprising:
    (a) forming a barrier around a predetermined area where the cavity is to be formed on a copper foil laminated master, an internal circuit formed in the copper foil laminated master;
    (b) coating a thermosetting material in the area where the cavity is to be formed;
    (c) laminating a dielectric layer and a copper foil layer on the copper foil laminated master, on which the thermosetting material is coated;
    (d) pressing the laminated dielectric layer and copper foil layer using a press plate, on which a protruded part is formed in an area corresponding to the area where the cavity is to be formed;
    (e) forming an external circuit pattern in the upper part of the laminated dielectric layer; and
    (f) dissolving the coated thermosetting material using a solvent and forming the cavity.

2. The method of claim 1, wherein the dielectric layer and copper foil layer are a resin coated copper foil or the dielectric layer is a prepreg.

3. The method of claim 1, wherein the barrier is printed by use of a screen method or by exposing a thermosetting film.

4. The method of claim 1, wherein the glass transition temperature (Tg) of the thermosetting material is higher than the glass transition temperature (Tg) of the dielectric layer.

5. The method of claim 1, wherein the thermosetting material does not mix with the dielectric layer.

6. The method of claim 1, further comprising (g) depositing in the formed cavity a bonding pad for electrically connecting an element and the substrate, by use of electrolytic plating or electroless plating.

* * * * *

UNITED STATES PATENT AND TRADEMARK OFFICE
CERTIFICATE OF CORRECTION

PATENT NO. : 7,498,205 B2
APPLICATION NO. : 11/524404
DATED : March 3, 2009
INVENTOR(S) : Hoe Ku Jung et al.

It is certified that error appears in the above-identified patent and that said Letters Patent is hereby corrected as shown below:

Title Page, Item (56) (Foreign Patent Documents), Line 1, change "2/2002" to --2/2000--.

Signed and Sealed this

Second Day of June, 2009

JOHN DOLL
*Acting Director of the United States Patent and Trademark Office*